US007379713B2

(12) United States Patent
Lindstedt

(10) Patent No.: US 7,379,713 B2
(45) Date of Patent: May 27, 2008

(54) METHOD FOR WIRELESS DATA INTERCHANGE BETWEEN CIRCUIT UNITS WITHIN A PACKAGE, AND CIRCUIT ARRANGEMENT FOR PERFORMING THE METHOD

(75) Inventor: Reidar Lindstedt, München (DE)

(73) Assignee: Infineon Technologies AG, Munich (DE)

( * ) Notice: Subject to any disclaimer, the term of this patent is extended or adjusted under 35 U.S.C. 154(b) by 370 days.

(21) Appl. No.: 10/879,467

(22) Filed: Jun. 29, 2004

(65) Prior Publication Data

US 2004/0266382 A1 Dec. 30, 2004

(30) Foreign Application Priority Data

Jun. 30, 2003 (DE) ................. 103 29 347

(51) Int. Cl.
*H04B 1/38* (2006.01)
(52) U.S. Cl. ............... 455/90.3; 455/41.1; 455/41.2; 455/66; 327/564
(58) Field of Classification Search ........... 455/90.3, 455/41.1, 41.2, 66, 79, 84, 351, 575, 252.1, 455/333; 327/564
See application file for complete search history.

(56) References Cited

U.S. PATENT DOCUMENTS 5,715,274 A 2/1998 Rostoker et al.
5,754,948 A * 5/1998 Metze ...................... 455/41.2
6,072,991 A * 6/2000 Paul et al. .................... 455/73
6,262,596 B1 * 7/2001 Schultz et al. ............... 326/41
6,674,971 B1 * 1/2004 Boggess et al. ............ 398/139
6,718,163 B2 * 4/2004 Tandy ....................... 455/90.2
7,015,559 B2 * 3/2006 Murphy et al. ............. 257/433
7,103,320 B2 * 9/2006 Goodnow et al. ............ 455/70

FOREIGN PATENT DOCUMENTS

DE 102 02 480 A1 8/2002

* cited by examiner

*Primary Examiner*—Matthew Anderson
*Assistant Examiner*—Tuan Pham
(74) *Attorney, Agent, or Firm*—Maginot, Moore & Beck

(57) ABSTRACT

Method for wireless data interchange between circuit units within a package, and circuit arrangement for performing the method. The invention provides a circuit arrangement having circuit units (101a-101n) which are arranged in a package (100), a connecting device (200) for connecting the circuit units (101a-101n) to one another and for data interchange between the circuit units (101a-101n), and connection units (203) for connecting the circuit units to external circuit units and for supplying electrical power to the circuit arrangement, where data interchange between the circuit units (101a-101n) arranged within the package (100) is performed using electromagnetic waves which are transmitted by transmission units (201a-201n) and are received by reception units (202a-202n). The circuit units (101a-101n) arranged in the package (100) are in this case respectively equipped with the transmission units (201a-201n) and the reception units (202a-202n).

18 Claims, 8 Drawing Sheets

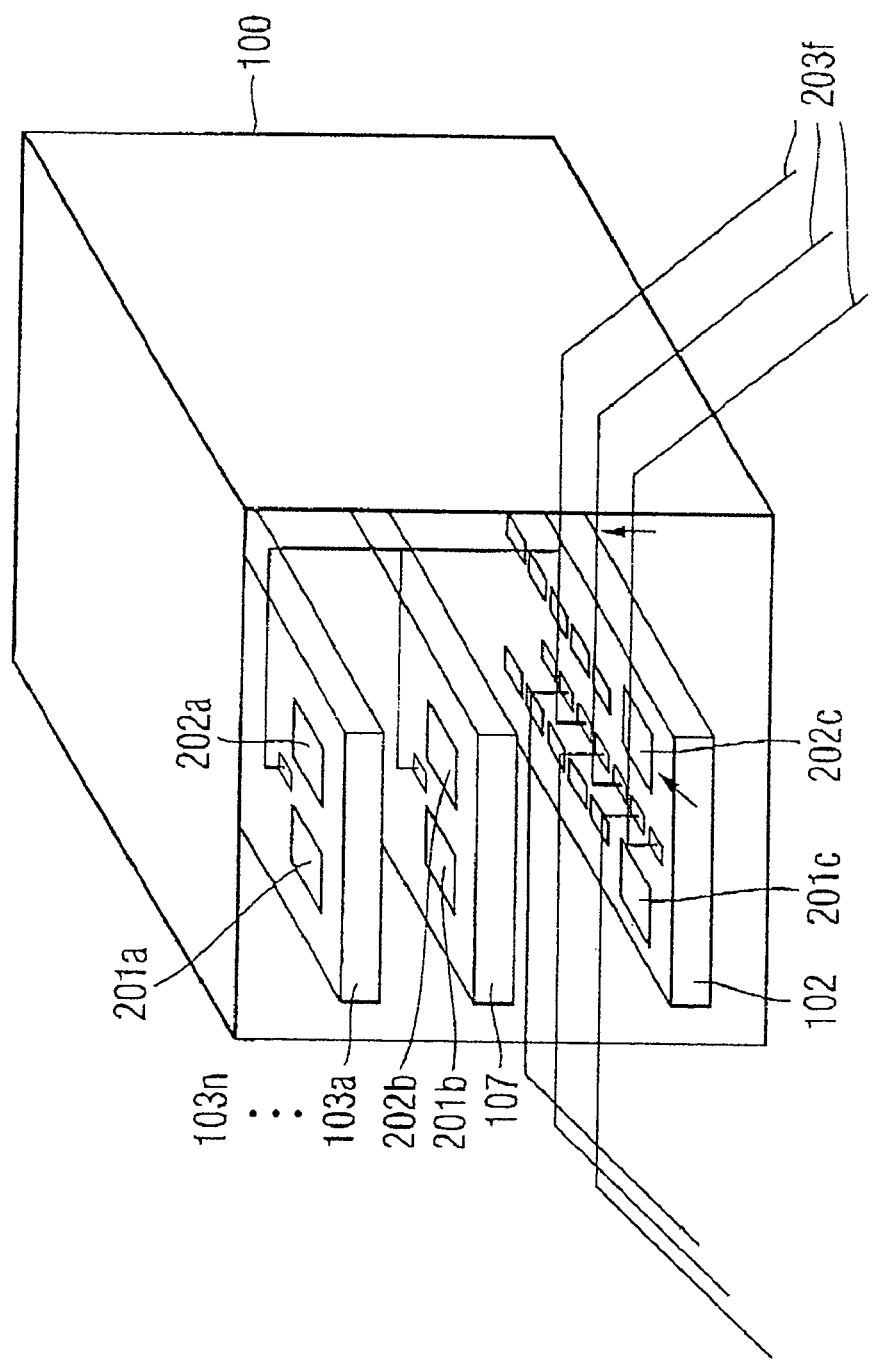

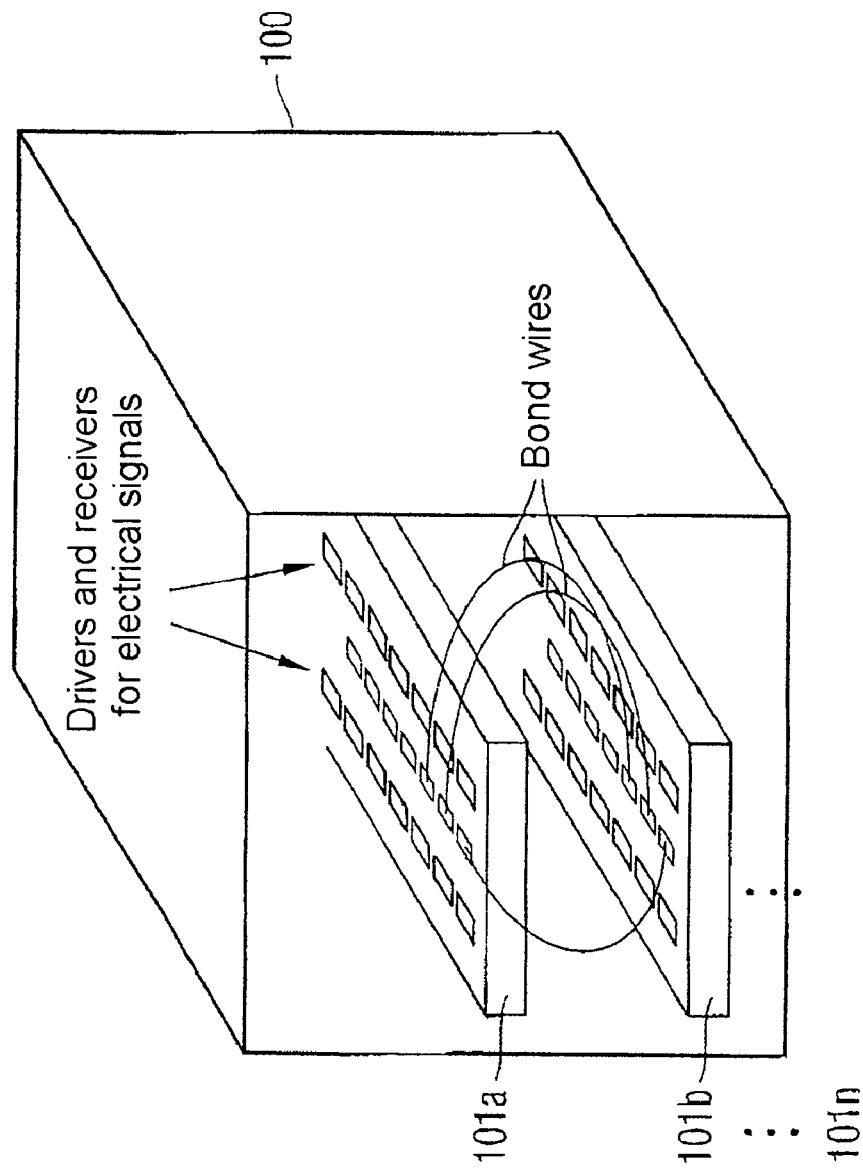

METHOD FOR WIRELESS DATA INTERCHANGE BETWEEN CIRCUIT UNITS WITHIN A PACKAGE, AND CIRCUIT ARRANGEMENT FOR PERFORMING THE METHOD

CROSS-REFERENCE TO RELATED APPLICATIONS

This application claims the benefit of German Patent Application 103 29 347.7 filed Jun. 30, 2003.

FIELD OF THE INVENTION

The present invention relates to electronic circuit units arranged within a package and relates in particular to the data interchange between the circuit units arranged in the package.

BACKGROUND

The increasing miniaturization of electronic systems entails a continual reduction in the size of the electronic components required for them. Besides reduced structure widths, further measures are also taken to produce electronic components and circuit units, on which these components are arranged, in as compact a form as possible.

One important way of achieving this aim is to arrange a plurality of circuit units or silicon chips, also referred to as "dies", in a single package, which may be made of plastic. In general, such silicon chips are then stacked one above the other, so that this arrangement is usually referred to as "stacked chips". With such "stacked chips", contact is conventionally made by virtue of it being necessary to route bonding wires from each connection pin on each chip to an externally routed contact and/or to a further chip, accommodated in the package.

Since demands on the signals to be transmitted being of parallel nature are continually rising, such contact among the circuit units within a conventional package is extremely disadvantageous. By way of example, signals in graphics memory units (graphics DRAM), digital signal processors (DSP) and processor chips or microprocessor circuit units need to be transmitted in highly parallel form, which means that the number of connection pins and of the bonding connections which are therefore necessary between circuit units in the package rises drastically. An increased number of bonding connections between the circuit units accommodated in the package inexpediently conflicts with the aim of miniaturizing the overall integrated circuit system which is accommodated in the package.

Another drawback is that a large number of bonding connections or bond wires gives rise to the possibility that these connections or wires will move and cause short circuits. In addition, an extremely high level of complexity and cost is involved in the method of manufacturing electronic systems in which a plurality of circuit units are accommodated in a package, with the circuit units being connected by bonding wires. Disadvantageously, this means that electronic systems based on the "stacked chips" principle cannot be produced in a package, or can be produced in a package only using a few circuit units.

Another proposal has been that contact between circuit units which are to be connected to one another be provided not just in one plane, i.e. in a contact plane, but rather three dimensionally.

Such a 3D contact system uses flexible circuit boards, for example, which can be designed three dimensionally in space in line with the contact requirements. However, the 3D contact systems have the drawback that they can firstly be manufactured only in complex fashion and give rise to a high level of cost. In addition, it is inexpediently impossible to provide a large number of parallel connections between circuit units, which is necessary for efficient data interchange in future electronic systems, solely using the 3D contact system.

FIG. 8 shows a conventional electronic circuit arrangement in which, by way of example, two circuit units 101a and 101b are accommodated in a package 100. The circuit units each have drivers and receivers for electrical signals. FIG. 8 also shows bonding wires or bond wires (bonding connections), which are conventionally necessary in order to provide data interchange between the circuit units 101a and 101b. It is thus obvious from a consideration of the electronic circuit arrangement illustrated in FIG. 8 that, in the case of relatively large scale integration, i.e. when a multiplicity of circuit units 101a-101n are provided in a single package 100, the bonding wires are extremely disadvantageous and conflict with miniaturization of the overall circuit arrangement.

It is therefore an object of the present invention to provide a circuit arrangement in which it is' possible to accommodate a large number of circuit units in a package in space saving fashion, avoiding the drawbacks of the prior art which are brought about as a result of the connections among the circuit units.

SUMMARY

A fundamental concept of the invention is to provide connecting devices for connecting circuit units accommodated in a package, which form an integrated electronic system or an integrated miniaturized circuit arrangement, and for data interchange between the circuit units not in the form of electrically conductive connecting means such as bonding wires and/or bonding connections, but rather to produce the corresponding connecting devices wirelessly, with data interchange within the chip package taking place using electromagnetic waves.

In this context, it is expedient if the circuit units accommodated in the package have at least one transmission unit for transmitting electromagnetic waves and at least one reception unit for receiving electromagnetic waves. The provision of wireless connecting means expediently affords the option of dispensing entirely with electrically conductive connections between the circuit units which are to be connected.

It is advantageous to connect just power supply lines for supplying the electrical circuit units with power which is provided by a power source arranged outside of the package. Within the package, the inventive circuit concept affords the considerable advantage that the circuit units can now be integrated into a package in extremely compact form. This firstly permits a great reduction in the package dimensions, i.e. further miniaturization is achieved, as required in electronic circuitry.

Secondly, it is possible to accommodate very many more electronic circuit units—electronic circuit chips—in a package than is possible using circuit arrangements based on the prior art. In this context, the transmission units and reception units which are to be additionally arranged on the circuit units to be connected may be produced in an extremely small form, since the range of the electromagnetic waves transmitted by these units need only be extremely short on account of the stipulation that the overall package be miniaturized. Another advantage is that the possible coding or multiplexing of the signals carried by the electromagnetic waves allows a high level of parallelism to be achieved and that the signals—unlike the bonding wires—may cross virtually arbitrarily.

Another advantage is that the connection setup concept presented can be used to transmit almost any number of signals simultaneously. In addition, one great advantage is that any connection pins on the circuit units which are to be connected can be dispensed with, since there is no bonding wire connection between the circuit units.

The advantage of very short transmission paths within a package in which the circuit units are arranged results in only very low transmission powers in the transmission units arranged on the circuit units being required to transmit electromagnetic waves. In this way, it is a simple matter to provide suitable shielding for the package in terms of radiation of electromagnetic waves externally.

This advantageously allows the use of extremely fast broadband signal transmission, i.e. signal transmission with a high level of parallelism, within the package. Almost all connecting devices which can comprise bonding wires may be replaced in this manner. Besides the advantage of now accommodating significantly more circuit units in a package than was possible with methods based on the prior art, there is the advantage that it is now also possible to combine those circuit units in a package for which this was impossible on account of the large number of connection pins or connections on them.

It is also expedient that when driving circuit units accommodated in the package it is possible to save chip area by virtue of the majority of the connection pins being able to be dispensed with.

This gives rise to the advantage that this allows a considerable increase in the scale of integration for circuit units which are in the form of memory units.

If one or more of the circuit units to be accommodated in a package are in the form of microprocessor units, for example, then there is the additional advantage of a significant reduction in cost, since microprocessor units normally require a large number of data connections, which can now be provided by connecting means on the basis of electromagnetic waves.

The inventive design of the circuit units which are to be accommodated in a package also advantageously allows circuit units to be made up individually on a customer specific basis which were previously not able to be accommodated in a single package. The basic components provided on the circuit units advantageously remain unchanged, and only transmission and reception units for transmitting and receiving electromagnetic waves need to be provided in addition on the circuit units.

The inventive circuit arrangement merely requires the provision of wired connecting means for power supply. One alternative to wired connecting means for power supply is to supply power, by way of example, using external magnetic fields, optical radiation, radio frequency fields etc. In this way, it would then be possible for all wired connecting means to be dispensed with.

The significant increase, provided by the inventive circuit arrangement and the inventive method, in the scale of integration of electronic components in the package results in a significant reduction in cost for the overall system. In application specific circuit units (ASIC=Application Specific Integrated Circuit), it is also advantageous that the application specific circuit units can be configured and modified extremely quickly by virtue of components being able to be added or omitted. This generates first prototypes (rapid prototyping) at a higher speed than in the case of methods based on the prior art. Like the microprocessor units, the application specific circuit units also have a large number of data connections, which means that the inventive connecting device for connecting the circuit units to one another in the package using electromagnetic waves have the effect of reducing cost.

If one or more circuit units are in the form of digital signal processors, then the advantage is obtained that the numerous connections in digital signal processors can be provided less expensively by the connecting means on the basis of electromagnetic waves.

Another advantage of the inventive circuit arrangement is that extremely short signal propagation times can be provided between the circuit units, since it is not necessary to route signals via the normally relatively long bonding wires or bonding connections. Another advantage is that parasitic effects as a result of long interconnects are avoided. Parasitic capacitances as a result of adjacent bonding wires thus do not exist in the inventive circuit arrangement.

Besides an increase in the level of parallelism, an increase in the data interchange rate is also advantageously provided. Since the basic components of the circuit units can remain unchanged, and just transmission and reception units for transmitting and receiving electromagnetic waves need to be provided, the circuit units to be accommodated in the package can advantageously be manufactured in mass production.

It is expedient to be able to use ordinary signal transmission protocols for the data interchange between the circuit units themselves and for the data interchange with external circuit units.

The inventive circuit arrangement essentially has:
a) at least two circuit units;
b) a package which contains the circuit units, the package being able to be miniaturized;
c) at least one connecting device for connecting the circuit units to one another and for data interchange between the circuit units; and
d) connection units for connecting the circuit arrangement to external circuit units and for supplying electrical power to the circuit arrangement, where the connecting device provided in the package has at least one transmission unit for transmitting electromagnetic waves and at least one reception unit for receiving electromagnetic waves, such that data are interchanged between the circuit units within the package wirelessly using the electromagnetic waves.

In addition, the inventive method for interchanging data between circuit units, with the circuit units being accommodated in a common package, has the following steps:
a) electrical power is supplied to the circuit units via a connection unit in the package;
b) data are interchanged with external circuit units via the connection unit; and
c) data are interchanged between the circuit units which are accommodated in the common package, where the data are interchanged between the circuit units within the package wirelessly using electromagnetic waves, the electromagnetic waves being transmitted using at least one transmission unit which is arranged on the circuit units, and the electromagnetic waves being received using at least one reception unit which is arranged on the circuit units.

In line with one preferred development of the present invention, the electromagnetic waves used to provide wireless data interchange between the circuit units are provided in the form of radio frequency radiation or in the form of optical radiation. Since only very short transmission paths need to be bridged, it is advantageous that the corresponding transmission powers in the transmission units provided on the circuit units for the purpose of transmitting the radio frequency radiation or the optical radiation can be kept low. In this context, only a sufficiently high signal-to-noise ratio needs to be observed for low loss signal transmission. In this respect, external EMC shielding against influences of radio frequency radiation outside of the package is expediently provided. Optical radiation has the advantage that external shielding can easily be provided by an opaque layer, while data interchange can be performed within the package using reflective surfaces.

In line with another preferred development of the present invention, the connecting device provides command, address and data connections. Particularly in the case of data connections, the inventive method advantageously results in a significantly increased level of flexibility and in a cost advantage. This can be attributed to the fact that a maximum number of connections is restricted in the case of conventional contact methods by the limited surface of the circuit unit, whereas the inventive method of data interchange using electromagnetic waves permits virtually any number of signals to be transmitted simultaneously. The number of signals which can be transmitted simultaneously is merely dependent on the frequency and on the signal-to-noise ratio. Currently, reliable transmission of all of the signals from any circuit unit, such as a microprocessor unit, an application specific circuit unit (ASIC), a digital signal processor etc. is advantageously possible.

In line with yet another preferred development of the present invention, the package contains a connection control unit for controlling connections to the external circuit units and for coordinating data interchange between the circuit units.

Advantageously, the connection control unit may be used for any circuit units, such as memory units, processor units, digital signal processors etc. The operating principle of the connection control unit is expediently independent of the operating principle of the circuit units which are to be connected.

In line with yet another preferred development of the present invention, the connection control unit provided in the package has connection units for connecting the connection control unit to external circuit units, a logic circuit unit for providing identifiers for the circuit units and for producing data protocols, at least one transmission unit for transmitting electromagnetic waves, and at least one reception unit for receiving electromagnetic waves, where data are interchanged between the circuit units and the connection control unit within the package wirelessly using the electromagnetic waves.

In line with yet another preferred development of the present invention, the connection control unit provided in the package is made of a flexible material, as is used for interposer layers, for example. Preferably, the circuits for the corresponding transmission and reception units and the connections to the outside can be integrated in one component. Another advantage is that the corresponding methods of manufacture, such as screen printing, are extremely inexpensive.

In line with yet another preferred development of the present invention, the connection units for connecting the circuit arrangement to external circuit units and for supplying electrical power to the circuit arrangement are provided wirelessly using magnetic fields and/or electrical fields and/or optical radiation. In this way, there is the advantage that the circuit arrangement has neither internal bonding wires for connecting the circuit units to one another nor external connection wires or connection lines in order to connect the circuit arrangement to external circuit units and in order to supply the circuit arrangement with supply power.

In line with yet another preferred development of the present invention, the package contains a controller unit for controlling at least one memory unit. In this context, the advantage arises that integrating a controller unit and at least one memory unit in a package and the signal connection therefor using electromagnetic waves allow extremely short signal propagation times without parasitic effects as a result of long interconnects. This makes it possible to achieve higher frequency ranges for driving the memory units than in conventional circuit arrangements. The overall system thus becomes less expensive, since it is possible to dispense with a separate arrangement for the individual components.

In line with yet another preferred development of the present invention, the package contains a microprocessor unit for processing the data which are to be transmitted. Preferably, the microprocessor unit provided in the package has a logic circuit unit for providing identifiers for memory unit and for processing data protocols, at least one transmission unit for transmitting electromagnetic waves, and at least one reception unit for receiving electromagnetic waves, with data being interchanged between the circuit units and the microprocessor unit within the package wirelessly using the electromagnetic waves.

In line with yet another preferred development of the present invention, the microprocessor unit provided in the package incorporates memory units which are integrated therein.

In line with yet another preferred development of the present invention, the package contains an application specific circuit unit (ASIC) for performing application specific operating steps for the overall circuit arrangement. Advantageously, the application specific circuit unit can be configured and modified extremely quickly as a result of the data interchange within the package using electromagnetic waves.

In line with yet another preferred development of the present invention, the package contains a digital signal processor which preferably provides data conversion. Expediently, the digital signal processor provided in the package incorporates memory units which are integrated therein. In particular, there is the advantage that the integration of the digital signal processor and the data interchange with the other circuit units using electromagnetic waves allow a saving on area for the circuit units or on chip area.

In line with yet another preferred development of the present invention, the wireless data interchange between the circuit units using electromagnetic waves is effected on the basis of a prescribed data protocol. Expediently, identifiers are output for all users, and signals are sent in the form of packets containing the identifiers of the sender and the addressees.

In line with yet another preferred development of the present invention, the wireless data interchange between the circuit units using electromagnetic waves is performed by multiplexing the data signals which are to be transmitted using different modulations of the transmission frequency.

In line with yet another preferred development of the present invention, an identifier for at least one circuit unit is provided when the corresponding circuit unit is activated, and is maintained until a power supply for the corresponding circuit unit is disconnected.

In line with yet another preferred development of the present invention, a connection control unit provided in the package acts as a master unit in order to control connections to the external circuit units and to coordinate data interchange between the circuit units.

In line with yet another preferred development of the present invention, a controller unit provided in the package acts as a master unit in order to control connections to the external circuit units and to coordinate data interchange for at least one memory unit.

In line with yet another preferred development of the present invention, one of the memory units provided in the package acts as a master unit in order to control connections to the external circuit units and to coordinate data interchange with the other memory units.

In line with yet another preferred development of the present invention, a microprocessor unit provided in the package acts as a master unit in order to control connections to the external circuit units and to coordinate data interchange between the circuit units.

In line with yet another preferred development of the present invention, an application specific circuit unit provided in the package acts as a master unit in order to control connections to the external circuit units and to coordinate data interchange between the circuit units accommodated in the package.

In line with yet another preferred development of the present invention, the circuit arrangement is supplied with electrical power wirelessly using magnetic fields and/or electrical fields and/or optical radiation.

In line with yet another preferred development of the present invention, the circuit arrangement communicates with external circuit units which are arranged outside of the package using magnetic fields and/or electrical fields and/or optical radiation.

Exemplary embodiments of the invention are illustrated in the drawings and are explained in more detail in the description below.

BRIEF DESCRIPTION OF THE DRAWINGS

In the drawings:

FIG. 7 shows a circuit arrangement in which at least one memory unit, a connection control unit and a digital signal processor are arranged in a package, where data are interchanged between the at least one memory unit, the connection control unit and the digital signal processor using electromagnetic waves, in line with another exemplary embodiment of the present invention; and FIG. 8 shows a conventional circuit arrangement in which circuit units are arranged in a package, with data interchange taking place between the circuit units using bond wires.

In the figures, identical reference symbols denote components or steps which have the same function.

DETAILED DESCRIPTION

Figure 1:
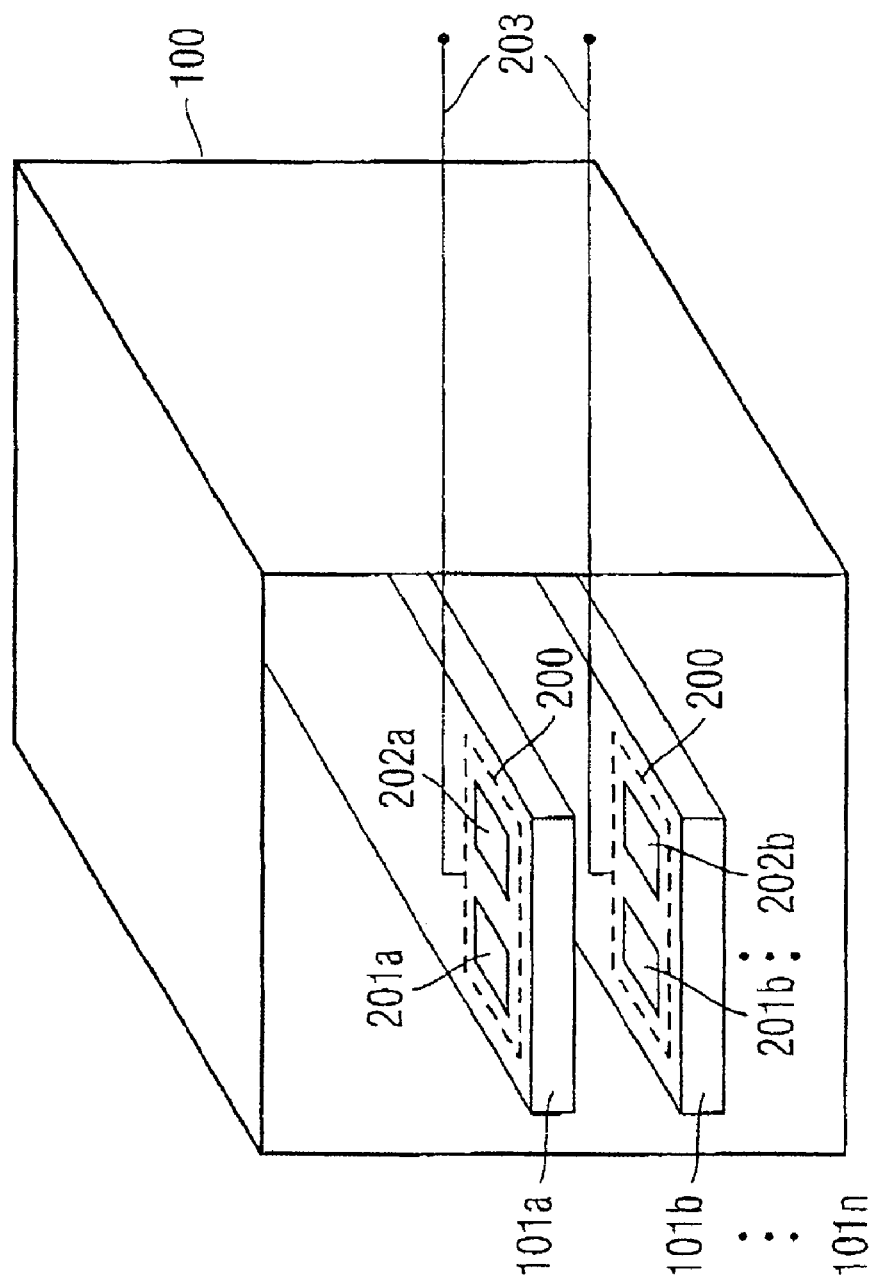
FIG. 1 shows a circuit arrangement in which at least two circuit units are arranged in a package, where the circuit units use electromagnetic waves to interchange data, in line with a preferred exemplary embodiment of the present invention.

FIG. 1 shows a circuit arrangement in which two circuit units 101a, 101b are arranged in a package 100. The circuit units can each be connected by means of connection units 203 to external circuit units, i.e. to circuit units which are arranged outside of the package 100. The connections 203 are used for data interchange with external circuit units and further for supplying power to the circuit units 101a, 101b which are inside the package 100.

A connecting device 200 provided in the package has at least one transmission unit 201a, 201b for transmitting electromagnetic waves and at least one reception unit 202a, 202b for receiving electromagnetic waves, such that data are interchanged between the circuit units 101a, 101b within the package wirelessly using the electromagnetic waves.

It will be pointed out that the inventive circuit arrangement is not limited to two circuit units 101a, 101b arranged in the package 100, but rather that any number n of circuit units 101a-101n can be arranged in the package 100, depending on application. In line with the invention, the circuit units 101a, 101b have transmission units 201a, 201b for transmitting electromagnetic waves and reception units 202a, 202b for receiving electromagnetic waves. It will be pointed out that the transmission units 201a, 201b and the reception units 202a, 202b may also be combined in the form of transmission/reception units, i.e. just one respective transmission/reception unit, i.e. a transceiver, may be provided on the circuit units 101a, 101b. The data interchange between the circuit units 101a, 101b arranged in the package 100 now takes place entirely wirelessly using electromagnetic waves.

It will be pointed out that the electromagnetic waves which are used to provide wireless data interchange between the circuit units 101a, 101b, ... 101n are in the form of radio frequency radiation or optical radiation. The transmission units 201a-201n for transmitting electromagnetic waves and the reception units 202a-202n for receiving electromagnetic waves may in this case be provided as separate transmission and receiver circuits, for example for radio frequency radiation, or may be integrated into the corresponding circuit units (chips).

Integration into the stacked circuit units (stacked chips) used has the great advantage that no additional electronic components are required. There is no longer any need for any bond wires or bonding connections between the circuit units 101a-101n as a result of the exemplary embodiment in line with the present invention. In principle, all connections which do not relate to power supply may be provided between the circuit units 101a-101n, such as command, address and data connections. However, it will be pointed out that the circuit arrangement may also be supplied with electrical power wirelessly using magnetic fields and/or electrical fields and/or optical radiation.

It is also possible for the circuit arrangement or the circuit units 101a-101n arranged in the package 100 to communicate with external circuit units using magnetic fields and/or electrical fields and/or optical radiation. The inventive circuit arrangement is particularly advantageous for data connections within the chip package 100, since the method of data interchange using electromagnetic waves results in significantly increased flexibility and a cost advantage. The reason for this is, inter alia, that a maximum number of connections is limited in the case of conventional connection techniques by the limited chip area or area of the circuit units 101a-101n.

The inventive method for interchanging data between circuit units 101a-101n which are accommodated in a common package 100 allows virtually any number of signals to be transmitted simultaneously or allows a drastic increase in a data interchange rate. The number of signals is defined only by the frequency and the signal-to-noise ratio. The number is large enough for all signals in an arbitrary chip or an arbitrary circuit unit, such as a microprocessor unit, an application specific circuit unit and a digital signal processor, to be able to be transmitted. The transmission speed provided by the transmission units 201a-201n and the reception units 202a-202n needs to be higher than the maximum data interchange rate. The average person skilled in the art will find, by way of example, transmission and reception units on the basis of radio frequency radiation at data transmission rates extending up to the GHz range. It is thus possible to provide adequate data transmission rates for wireless communication between circuit units 101a-101n in a package 100.

It is important for a transmission frequency for the electromagnetic radiation which is output by the respective transmission unit 201a-201n not to match an operating frequency for a circuit unit 101a-101n which is arranged in the package 100, since otherwise disturbing resonance effects could arise. On account of the short transmission paths within a chip package 100, only a very low transmission power is required, but it is necessary to provide a sufficiently high signal-to-noise ratio for data transmission without interference or losses.

EMC (electromagnetic compatibility) shielding with respect to the exterior of the package 100 needs to be provided by the package itself, i.e. no electromagnetic rays must enter the package 100 from outside or must leave the package 100, so that they do not influence external circuit units and are not subjected to interference from external circuit units. The transmission units 201a-201n and the reception units 202a-202n or the combined transmission/reception units can have multiplexer circuits which thus transmit a large number of data signals simultaneously through suitable modulation. This is particularly important in the case of circuit units which have a large number of parallel data channels, such as graphics memory units (graphics DRAMs (Dynamic Random Access Memory)). In the case of digital signal processors too, high data rates for data interchange between the signal processor and the surrounding circuit units 101a-101n can be expected.

The data interchange between the circuit units 101a-101n is effected using a protocol in which identifiers for all of the users (for example all circuit units 101a-101n) are initially output, with signals being transmitted in the form of packets containing the identifiers of the sender (sending circuit unit) and the addressee (addressed circuit unit). Each circuit unit is identified when the corresponding circuit unit 101a-101n is started up, said identification being performed by the transmission units 201a-201n and/or by the reception units 202a-202n. Hence, an identifier for at least one circuit unit 101a-101n is provided when the corresponding circuit unit 101a-101n is activated, and is maintained until a power supply for the corresponding circuit unit 101a-101n is disconnected. Using the identifier, each circuit unit 101a-101n then identifies which signals or signal packets or data it needs to receive. The protocols used comprise conventional protocols for data transmission, as are known to the person skilled in the art, such as Bluetooth, mobile radio etc. By grouping the signals into packets, it is possible to increase a data transmission speed further.

Hence, the advantage of the inventive circuit arrangement and of the inventive method for interchanging data between circuit units 101a-101n which are arranged in a common package becomes noticeable through fast broadband, i.e. greatly parallel, signal transmission within the package 100.

This data transmission replaces almost all bonding wires or bonding connections. This makes it possible to combine many more circuit units (chips) 101a-101n in a single package 100 in miniaturized form. In addition, the inventive method makes it possible to combine circuit units in a package 100 which were unable to have this done for them on account of the large number of necessary connections to surrounding circuit units in the package 100. The greatly parallel and extremely space-saving transmission of data between the circuit units 101a-101n makes it possible to provide smaller circuit arrangements and consequently to reduce the costs of circuit integration to a significant degree.

Figure 2:
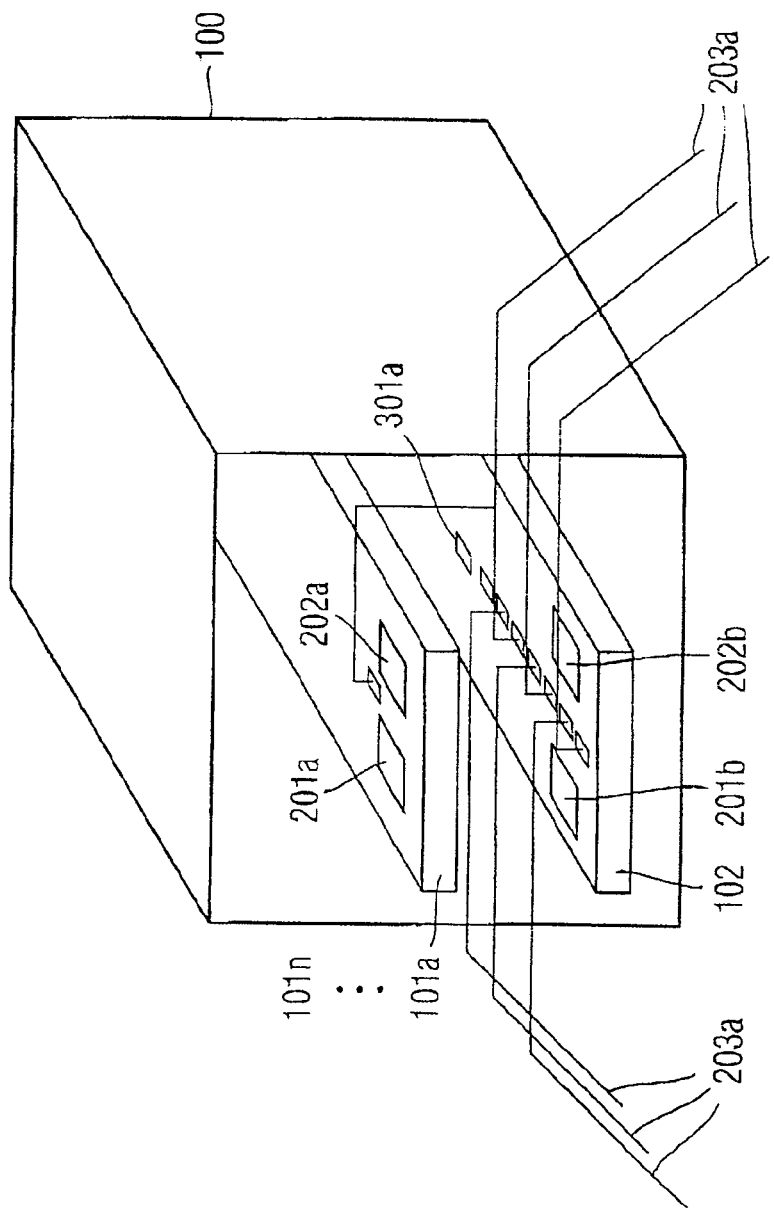
FIG. 2 shows a circuit arrangement having circuit units arranged in a package and also a connection control unit arranged in the package, where the circuit units and the connection control units interchange data using electromagnetic waves, in line with another exemplary embodiment of the present invention.

FIG. 2 shows a circuit arrangement in which a circuit unit 101a is arranged together with a connection control unit 102 in a package 100, where the at least one circuit unit 101a and the connection control unit 102 interchange data using electromagnetic waves, in line with another preferred exemplary embodiment of the present invention.

FIG. 2 shows a single circuit unit 101a by way of example for a plurality of circuit units 101a-101n. This circuit unit 101a has, as described above with reference to FIG. 1, a transmission unit 201a and a reception unit 202a, respectively. The way in which these transmission and reception units work is described above with reference to FIG. 1, and an explanation is omitted here in order to avoid any overlapping description.

In addition, the circuit arrangement shown in FIG. 2 has a connection control unit 102 which is provided for controlling connections to external circuit units and for coordinating the data interchange between the circuit units 101a-101n. The connection control unit 102 provided in the package 100 thus acts as a master unit which is provided as a separate circuit unit. In addition, it is possible for one of the other circuit units 101a-101n to act as a master unit. A significant advantage of the connection control unit 102 is that all other circuit units 101a-101n can be manufactured and connected identically, for example in the case of stacked memory units.

A connection unit 203a is used in order to communicate with external circuit units and/or in order to supply power to the connection control unit 102 and/or to the other circuit units 101a-101n. The connection control unit 102 itself again has at least one transmission unit 201b and at least one reception unit 202b. A particular advantage of the connection control unit is that it can be used extremely flexibly and can be produced inexpensively. Preferably, the connection control unit provided in the package 100 has the connection units 203a for connecting the connection control unit 102 to external circuit units, a logic circuit unit 301a for providing identifiers for the circuit units 101a-101n and for producing data protocols, the at least one transmission unit 201b for transmitting electromagnetic waves and the at least one reception unit 202b for receiving electromagnetic waves arranged on its circuit chip, with data being interchanged between the circuit units 101a-101n and the connection control unit 102 and between the circuit units 101a-101n themselves within the package 100 wirelessly using the electromagnetic waves. Preferably, the connection control unit provided in the package is formed from a flexible material. This material may be, by way of example, a material such as is used for interposer layers. In this case, the circuits for the transmission and reception units and the connecting lines to the outside are integrated inexpensively in a single circuit unit. This allows the circuit unit to be manufactured extremely inexpensively, for example using a screen printing method.

The connection units 203, 203a-203f for connecting the circuit arrangement to external circuit units and for supplying electrical power to the circuit arrangement can also be provided wirelessly using magnetic fields and/or electrical fields and/or optical radiation. Preferably, the connection control unit 102 provided in the package 100 acts as a master unit in order to control connections to the external circuit units and to coordinate data interchange between the circuit units 101a-101n. In order for the circuit units 101a-101n to communicate with the communication control unit 102, a protocol is required which assigns each circuit unit 101a-101n an identifier, as described above with reference to FIG. 1.

Advantageously, the connection control unit 102 may be used for any number of circuit units 101a-101n and for any number of types of circuit units, such as memory units, microprocessor units, digital signal processors etc. The number of channels supported or the bandwidth and the speed of the data transmission needs to be provided adequately in the transmission units and in the reception units.

The fundamental advantage of providing a connection control unit 102 is that it provides an inexpensive platform for data interchange using electromagnetic waves within the package 100 without the need for specific circuit units 101a-101n to act as master units. The connection control unit 102 thus performs the function of the master unit in data communication with the other circuit units 101a-101n.

Figure 3:
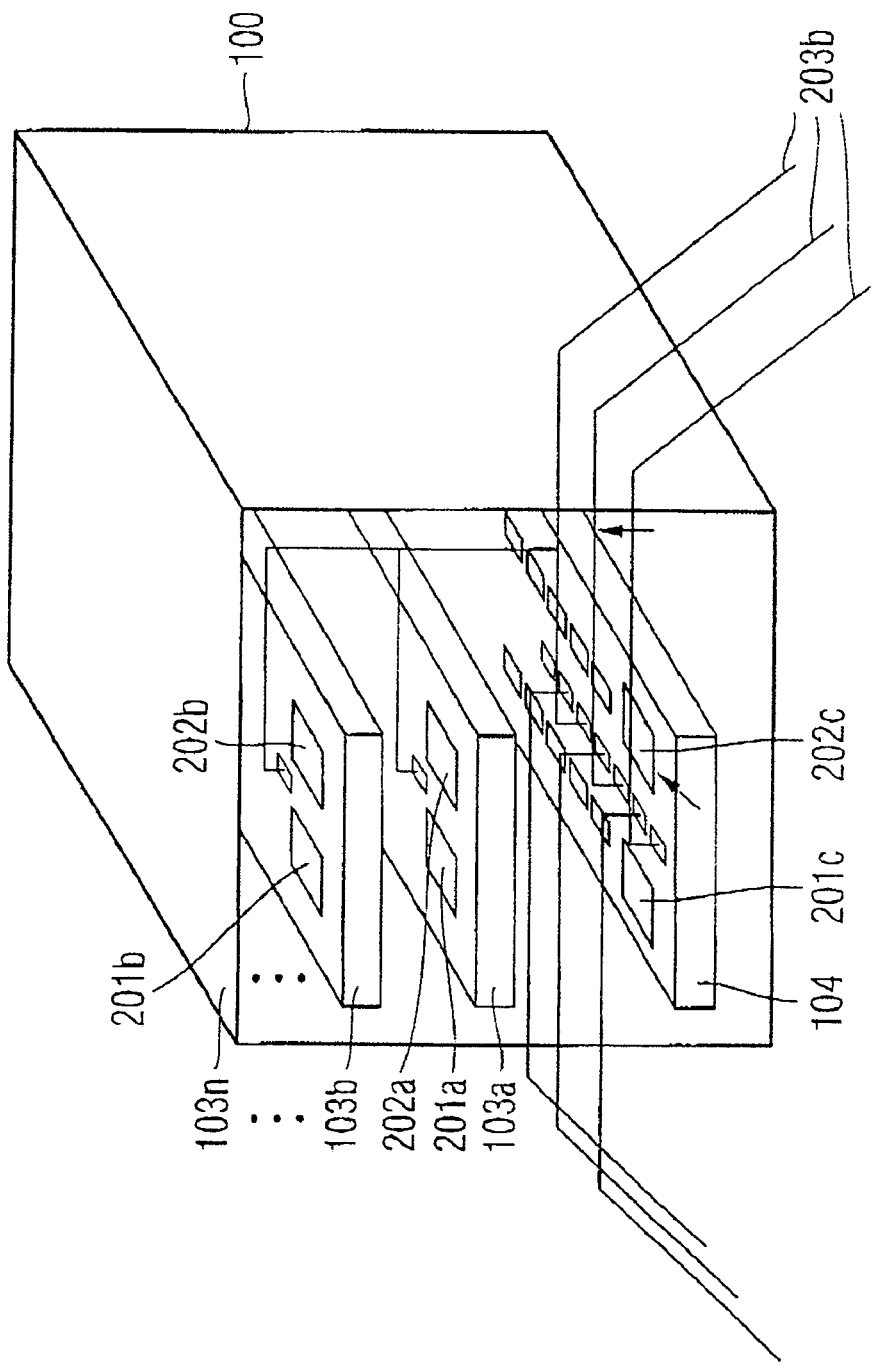
FIG. 3 shows a circuit arrangement in which memory units are arranged together with a memory controller unit in a package, where the controller unit and the memory units interchange data using electromagnetic waves, in line with another exemplary embodiment of the present invention.

FIG. 3 shows a circuit arrangement in which the circuit units 101a-101n are in the form of memory units 103a-103n, where a controller unit 104 is provided for the memory units 103a-103n, in line with another exemplary embodiment of the present invention.

The circuit units which are in the form of a memory unit 103a-103n each have, as explained with reference to FIG. 1, transmission units 201a-201n and reception units 202a-202n or combined transmission/reception units. In addition, the controller unit 104 likewise has at least one transmission unit 201c and at least one reception unit 202c.

Today's controller units 104 for memory units are extremely complex circuits which control data storage in the memory units 103a-103n.

Normally, the memory units 103a-103n are physically separate from a controller unit 104 and are generally arranged in modular fashion. The inventive circuit arrangement makes it possible for one or more of the memory units 103a-103n to be accessed wirelessly by the controller unit 104. In comparison with the wire-connected communication between a controller unit and memory units, the inventive method for interchanging data using electromagnetic waves attains a higher data transmission rate. In addition, the advantage is obtained that parasitic effects caused by lines and losses of quality in the signals, which have a disturbing effect particularly at high frequencies, do not arise.

Preferably, the controller unit 104 is arranged together with a plurality of memory units 103a-103n in a single package 100, as shown in FIG. 3. Depending on the design of the transmission units 201a-201n and/or the reception units 202a-202n, a plurality of data transmission paths can be laid together, so that essentially only one central data transmission path is required between the respective transmission units 201a-201n and the respective reception units 202a-202n.

Particularly when driving circuit units 101a-101n or memory units 103a-103n which require a large number of data signals, such as graphics chips, this arrangement can a considerable amount of chip area to be saved. Forwarding signals, e.g. in the data transmission path of the controller unit 104 for the memory units, is preferably based on the conventional method. The controller unit 104 is connected to external circuit units by means of connection units 203b for the purpose of communication. In addition, the connection units 203b are used to provide a power supply for the controller unit 104 and for the memory units 103a-103n.

The controller unit 104 is thus provided for controlling at least one memory unit 103a-103n. Preferably, the controller unit 104 provided in the package 100 acts as a master unit in order to control connections to the external circuit units and to coordinate data interchange for at least one memory unit 103a-103n. It is also possible for one of the memory units 103a-103n provided in the package 100 to act as a master unit in order to control connections to the external circuit units and to coordinate data interchange with the other memory units 103a-103n.

It is also possible for the controller unit 104 to be coupled to the connection control unit 102 described with reference to FIG. 2, so that data transmission to external circuit units which are arranged outside of the package 100 is provided by the connection control unit 102. Integrating the controller unit 104 and the memory units 103a-103n into the package and providing data interchange using electromagnetic waves allow extremely short signal propagation times without parasitic effects as a result of long interconnects. This achieves higher frequency ranges than in the case of conventional, wire-connected data transmissions for memory units 103a-103n. This makes the overall system less expensive.

Figure 4:
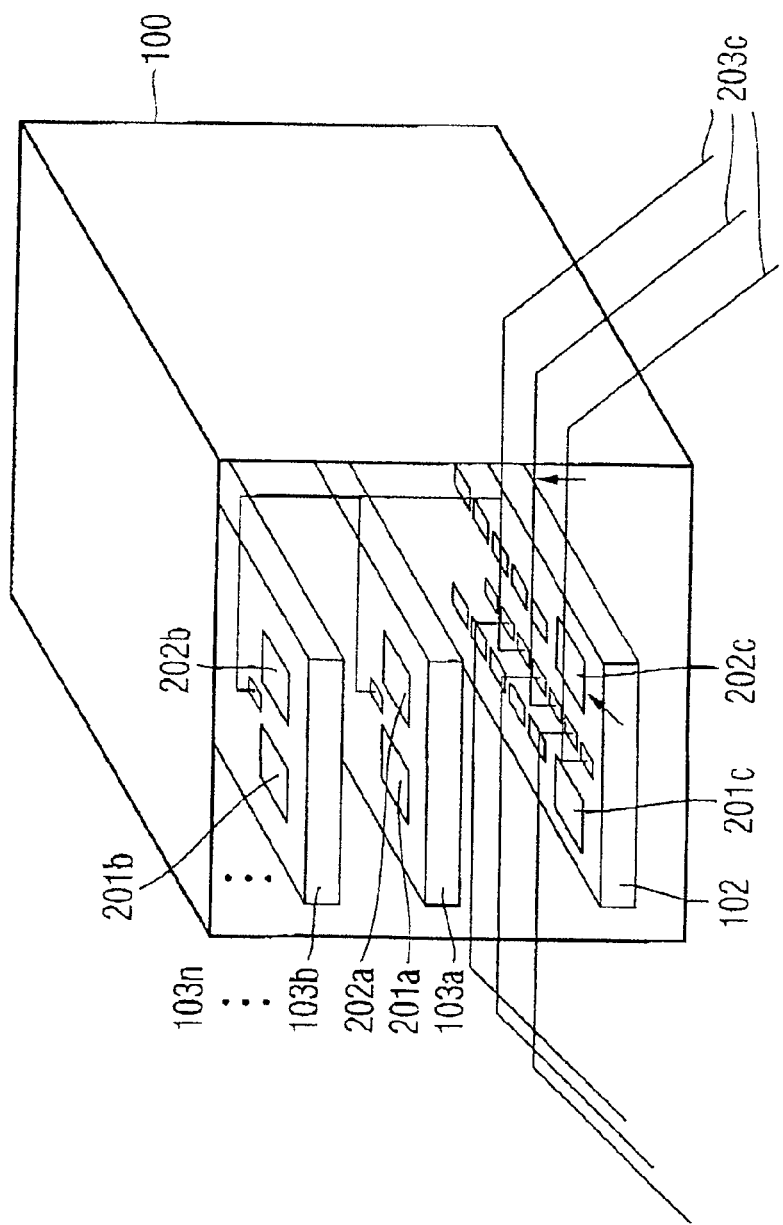
FIG. 4 shows a circuit arrangement in which a package contains memory units and a connection control unit, where the connection control unit and the memory units interchange data using electromagnetic waves, in line with another exemplary embodiment of the present invention.

FIG. 4 shows a circuit arrangement in which memory units 103a, 103b are arranged together with the connection control unit 102 in the package 100, in line with another exemplary embodiment of the present invention.

Data interchange with external circuit units and a power supply for the circuit units arranged in the package are provided by connection units 203c. The connection control unit 102 and the memory units 103a-103n have, as described above, transmission units 201-201n and reception units 202a-202n, respectively, in order to provide data interchange on the basis of electromagnetic waves.

If the package contains only memory units 103a-103n, then one of the memory units 103a-103n provided in the package 100 performs the function of a master unit in order to control connections to the external circuit units and to coordinate data interchange with the other memory units, as explained above with reference to FIG. 3. In addition, the function of the master unit can be performed by the connection control unit 102 shown in FIG. 4. The function of the connection control unit 102 has already been explained above with reference to FIG. 2.

Figure 5:
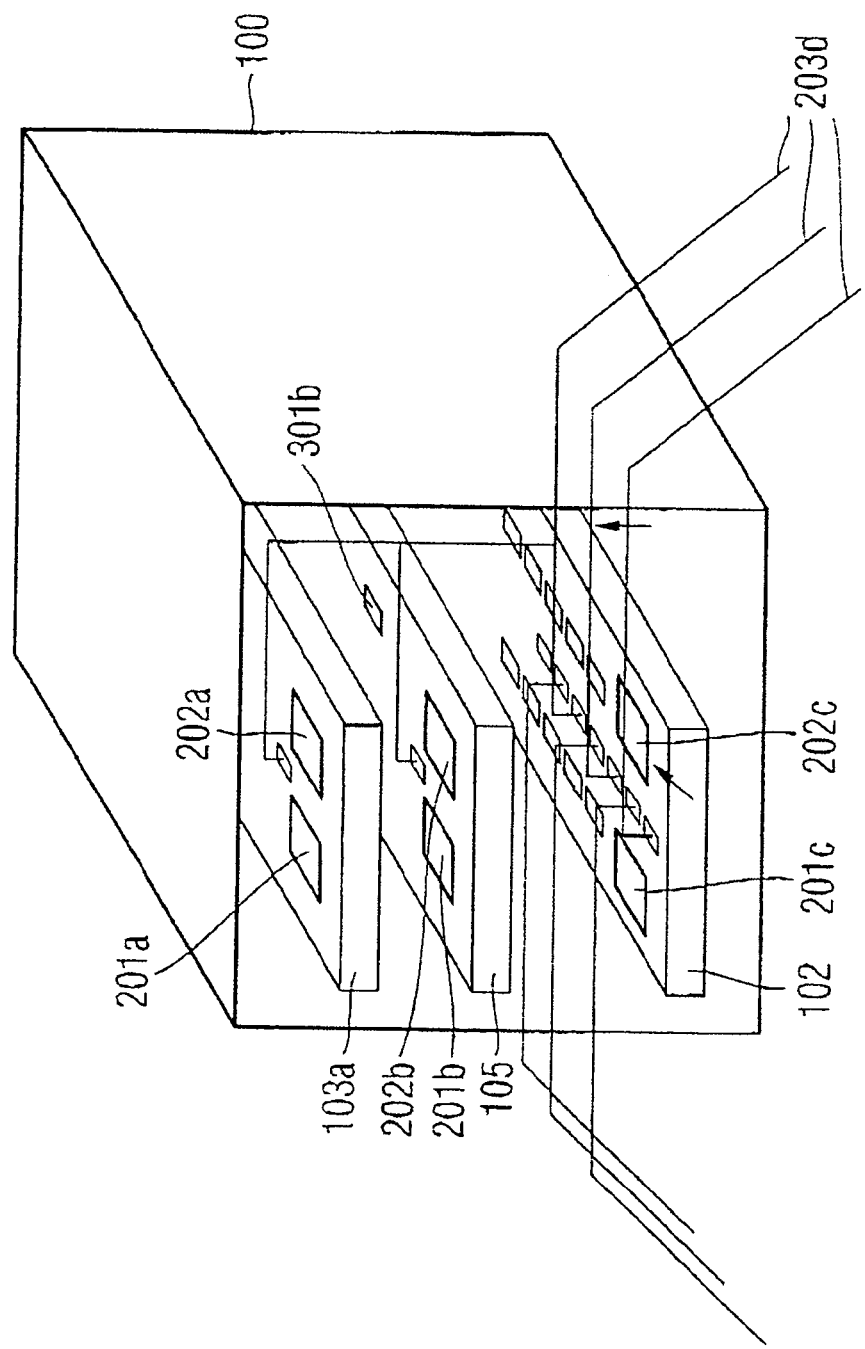
FIG. 5 shows a circuit arrangement in which at least one memory unit, a connection control unit and a microprocessor unit are arranged in a package, where the connection control unit, the at least one memory unit and the microprocessor unit interchange data using electromagnetic waves, in line with another exemplary embodiment of the present invention.

FIG. 5 shows a circuit arrangement in which the package 100 contains, besides at least one memory unit 103a, a microprocessor unit 105 and a connection control unit 102. The microprocessor unit 105 arranged in the package 100 is used to process the data which are to be transmitted. Preferably, the microprocessor unit 105 has a logic circuit unit 301b for providing identifiers for the memory units 103a-103n and for processing data protocols, at least one transmission unit 201b for transmitting electromagnetic waves, and at least one reception unit 202b for receiving electromagnetic waves, with data being interchanged between the memory units 103a-103n and the microprocessor unit 105 within the package 100 wirelessly using the electromagnetic waves.

Preferably, the microprocessor 105 provided in the package 100 acts as a master unit in order to control connections to the external circuit units and to coordinate data interchange between the circuit units 101a-101n.

The connections to the external circuit units and also to externally arranged power supply sources for supplying electrical power to the circuit arrangement shown in FIG. 5 are provided by connection units 203d. Advantageously, conventional signal transmission protocols which are known to the person skilled in the art may be used for data interchange between the circuit units arranged in the package 100 and for data interchange with the external circuit units arranged outside of the package 100.

It is particularly advantageous if the memory units 103a-103n described with reference to FIG. 4 and also the controller unit 104 are integrated into the package for the microprocessor unit 105. This allows extremely short signal propagation times without parasitic effects as a result of long interconnects. The method for interchanging data in line with the invention can be used with particular advantage for microprocessor units, which normally have numerous data connections. The other components shown in FIG. 5 correspond to those in the previous figures, which means that an explanation thereof has been omitted in order to avoid any overlapping description.

Figure 6:
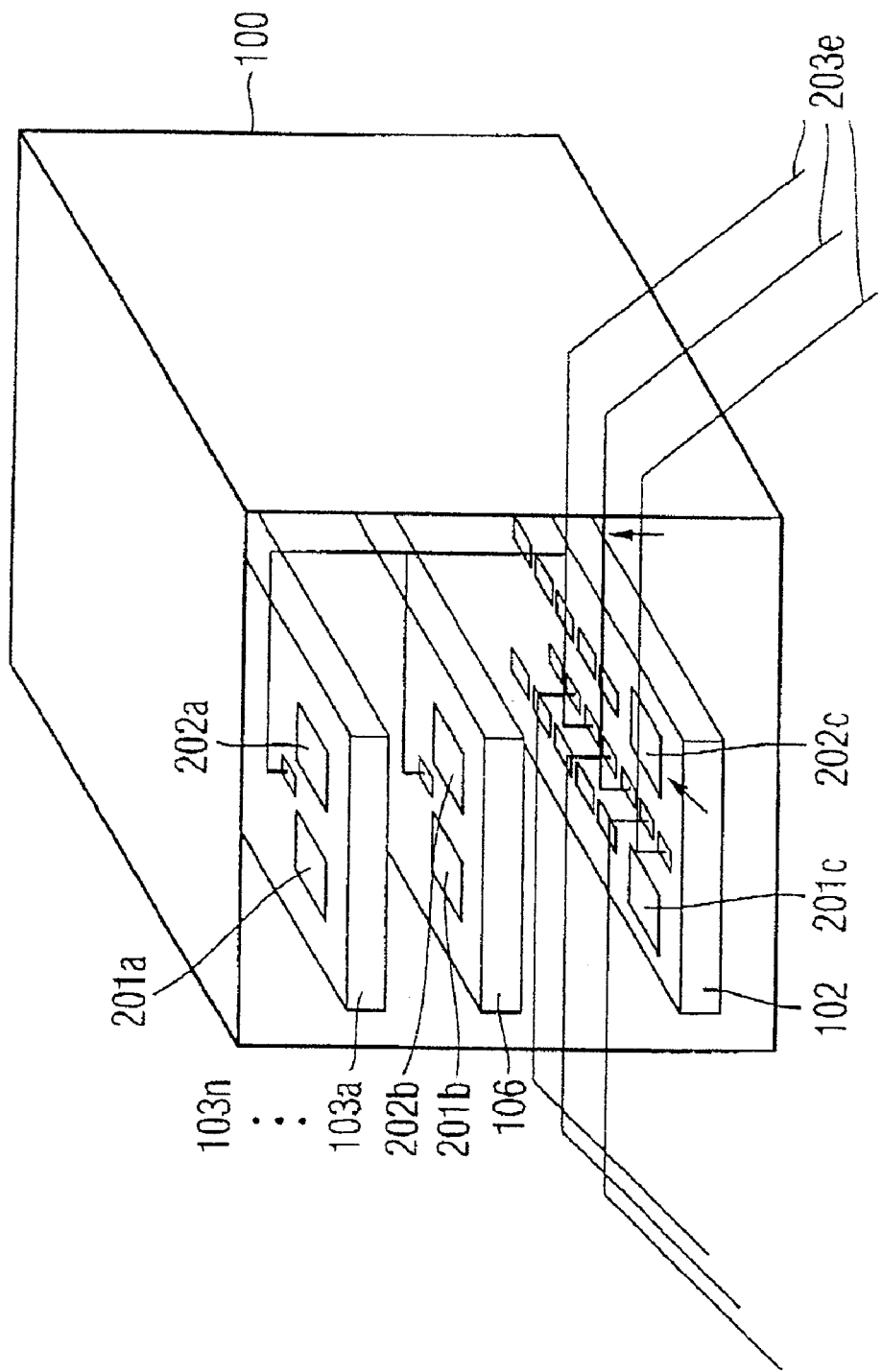
FIG. 6 shows a circuit arrangement in which at least one memory unit, a connection control unit and an application specific circuit unit are arranged in a package, where the application specific circuit unit interchanges data with the at least one memory unit and the connection control units using electromagnetic waves, in line with another exemplary embodiment of the present invention.

FIG. 6 illustrates a circuit arrangement in which a package 100 contains one or more memory units 103a-103n, a connection control unit 102 and an application specific circuit unit 106. The memory unit 103a has a transmission unit 201a and a reception unit 202a, the connection control unit 102 has a transmission unit 201c and a reception unit 202c, and the application specific circuit unit 106 has a transmission unit 201b and a reception unit 202b. It will be pointed out that the application specific circuit unit 106 may be in the form of an ASIC circuit (Application Specific Integrated Circuit).

Preferably, the application specific circuit unit 106 provided in the package 100 incorporates memory units 103a-103n which are integrated in it. The application specific circuit unit 106, which is based on FPGAs (Field Programmable Gate Array), for example, and integrates different circuit units on one chip, such as memory blocks or signal processing units. The inventive method for interchanging data using electromagnetic waves within a chip package 100 unifies the process steps required for different circuit units on one circuit unit, i.e. the application specific circuit unit 106. In this context, the inventive method for interchanging data using electromagnetic waves makes it possible, particularly in the case of application specific circuit units, to reduce the chip area, since multiplexing the signals using different modulations of the transmission frequency makes it possible to achieve a high level of parallelism for the data transmission between the application specific circuit unit 106 and the other circuit units 101a-101n or the memory units 103a-103n.

The application specific circuit unit 106 provided in the package 100 preferably acts as a master unit in order to control connections to the external circuit units and to coordinate data interchange between the circuit units 101a-101n.

The connections to the external circuit units and also to externally arranged power supply sources for supplying electrical power to the circuit arrangement shown in FIG. 6 are provided by connection units 203e. Advantageously, conventional signal transmission protocols known to the person skilled in the art may be used for the data interchange between the circuit units arranged in the package 100 and for the data interchange with the external circuit units arranged outside of the package 100.

FIG. 7 shows a circuit arrangement in which a package contains at least one memory unit 303a together with a connection control unit 102 and a digital signal processor 107. As described above with reference to FIGS. 1 to 6, data interchange between the circuit units arranged in the package 100 again takes place using electromagnetic waves.

To this end, the at least one memory unit 103a has a transmission unit 201a and a reception unit 202a, while the connection control unit 102 has a transmission unit 201c and a reception unit 202c. For the purpose of data communication with the connection control unit and with the memory unit, the digital signal processor likewise has transmission and reception units, namely a transmission unit 201b for transmitting electromagnetic waves and a reception unit 202b for receiving electromagnetic waves. The digital signal processor 107 provided in the package 100 allows data conversion. The digital signal processor 107 preferably incorporates memory units 103a-103n which are integrated in it. Preferably, the digital signal processor 107 provided in the package 100 acts as a master unit in order to control connections to the external circuit units and to coordinate data interchange between the circuit units 101a-101n.

It will be pointed out that the circuit units 101a-101n are to be understood to mean one or more of the following circuit units: memory units 103a-103n, controller units 104, microprocessor units 105 and/or application specific circuit units 106.

Connections to the external circuit units and also connections to externally arranged power supply sources for supplying electrical power to the circuit units 101a-101n arranged in the package are provided by means of the connection units 203f.

The connection unit 103f may be formed by bonding wires or bonding connections. It is also possible for the circuit arrangement to be supplied with electrical power wirelessly using magnetic fields and/or electrical fields and/or optical radiation. Communication between the circuit arrangement and external circuit units which are arranged outside of the package 100 can likewise take place using magnetic fields and/or electrical fields and/or optical radiation.

It will be pointed out that the exemplary embodiments of the present invention which are illustrated in FIGS. 1 to 7 can be combined with one another, i.e. different circuit units may be combined in a package 100 depending on the application.

Although the present invention has been described above with reference to preferred exemplary embodiments, it is not limited thereto but rather may be modified in a wide variety of ways.

The invention is also not limited to the application options mentioned.

The invention claimed is:

1. A circuit package comprising:
   a first and a second circuit unit within the circuit package;
   a connection unit operable to connect to at least one external circuit and to provide electrical power to the circuit package, wherein the connection unit is operable to wirelessly connect the circuit package to an external circuit unit and to obtain electrical power from an optical field;
   a transmission unit operable to transmit electromagnetic waves and operably connected to the first circuit unit, wherein the electromagnetic waves are provided as optical radiation; and
   reception unit operable to receive electromagnetic waves and operably connected to the second circuit unit, wherein the electromagnetic waves are provided as optical radiation, such that data from the first unit may be transmitted by electromagnetic waves to the second unit through the transmission unit and the reception unit;
   wherein the second circuit unit comprises a connection control unit operable to control connections to at least one circuit external the package and to coordinate data interchange with the first circuit unit; and
   wherein the connection control unit comprises:
      the connection unit;
      a logic circuit operable to provide identifiers for the first and the second circuit units and to provide data protocols; and
      at least one transmission unit operable to transmit electromagnetic waves, such that data may be interchanged between the connection unit and the first circuit unit using electromagnetic waves.

2. The circuit package of claim 1, wherein the data comprises command and address data.

3. The circuit package of claim 1, wherein the connection control unit is fabricated from flexible material.

4. The circuit package of claim 1, wherein:
   the first circuit unit comprises a memory unit: and the second circuit unit comprises a controller unit operable to control the memory unit.

5. The circuit package of claim 1, wherein the second circuit unit comprises:
   a microprocessor unit operably configured to coordinate data interchange with the first circuit unit.

6. The circuit package of claim 5, wherein the first circuit unit comprises a memory unit, and wherein the microprocessor unit comprises:
   a logic circuit operable to provide an identifier for the memory unit and to provide data protocols; and
   at least one transmission unit operable to transmit electromagnetic waves, such that data may be interchanged between the microprocessor unit and the plurality of memory units using electromagnetic waves.

7. The circuit package of claim 5, wherein:
   the first circuit unit comprises a memory unit; and
   the second circuit unit comprises the first circuit unit.

8. The circuit package of claim 1, wherein the second circuit unit comprises:
   an application specific circuit unit operable to perform application specific operating steps for the circuit package.

9. The circuit package of claim 8 wherein:
   the first circuit unit comprises a memory unit; and
   the application specific circuit unit and the memory unit are on a single chip.

10. The circuit package of claim 1, wherein the second circuit unit comprises: a digital signal processor unit.

11. The circuit package of claim 10, wherein:
    the first circuit unit comprises a memory unit; and
    the digital signal processor unit and the memory unit are on a single chip.

12. A method of transferring data between circuit units in a package comprising the steps of:
    providing a package with a first and a second circuit unit;
    providing electrical power to the first and the second circuit unit using a connection unit, wherein the step of providing power comprises subjecting the connection unit to optical radiation;
    transmitting first data using optical radiation from the first circuit unit using an electromagnetic wave transmission unit, wherein the step of transmitting comprises the step of transmitting the first data using optical radiation;
    receiving the electromagnetically transmitted first data with a reception unit associated with the second circuit unit, wherein the step of receiving comprises the step of receiving optical radiation;
    providing an identifier and data protocol for the first circuit unit; and
    transmitting the identifier and data protocol for the first circuit unit.

13. The method of claim 12, wherein the step of transmitting comprises the steps of:
    formatting the first data in accordance with a predetermined format; and
    transmitting the formatted first data.

14. The method of claim 12, wherein the step of transmitting comprises the steps of:
    multiplexing a first data signal and a second data signal; and
    transmitting the multiplexed signal.

15. The method of claim 12, wherein the second circuit unit is a connection control unit, the method further comprising the steps of:
    controlling connections to the package with the connection control unit; and
    coordinating the transmission of data from the first circuit unit with the connection control unit.

16. The method of claim 12, wherein the second circuit unit is a controller unit, the method further comprising the steps of:

controlling connections to the package with the controller unit; and coordinating the transmission of the first data from the first circuit unit with the controller unit.

17. The method of claim 12, wherein the second circuit unit is a memory unit, the method further comprising the steps of:

controlling connections to the package with the memory unit; and coordinating the transmission of the first data from the first circuit unit with the memory unit.

18. The method of claim 12, wherein the second circuit unit is an application specific circuit unit, the method further comprising the steps of:

controlling connections to the package with the application specific circuit unit; and coordinating the transmission of the first data from the first circuit unit with the application specific circuit unit.

* * * * *